United States Patent [19]
Gray et al.

[11] Patent Number: 5,898,601
[45] Date of Patent: *Apr. 27, 1999

[54] COMPUTER IMPLEMENTED METHOD FOR COMPRESSING 24 BIT PIXELS TO 16 BIT PIXELS

[75] Inventors: Patricia Gray, Mesa; Jackie Harrison, Chandler, both of Ariz.; Mike Keith, Portland, Oreg.

[73] Assignee: Intel Corporation, Santa Clara, Calif.

[*] Notice: This patent is subject to a terminal disclaimer.

[21] Appl. No.: 08/768,750

[22] Filed: Dec. 17, 1996

Related U.S. Application Data

[63] Continuation of application No. 08/601,800, Feb. 15, 1996, Pat. No. 5,621,674.

[51] Int. Cl.$^6$ .............................. G06F 7/00; G06F 15/00
[52] U.S. Cl. .................. 364/715.02; 382/233; 382/235; 395/102; 395/109; 395/112
[58] Field of Search ...................... 364/715.02; 348/387; 382/232, 233, 235; 395/102, 109, 112

[56] References Cited

U.S. PATENT DOCUMENTS

| | | | |
|---|---|---|---|
| 3,711,692 | 1/1973 | Batcher | 235/175 |
| 3,723,715 | 3/1973 | Chen et al. | 235/175 |
| 4,161,784 | 7/1979 | Cushing et al. | 364/748 |
| 4,393,468 | 7/1983 | New | 364/736 |
| 4,418,383 | 11/1983 | Doyle et al. | 364/200 |
| 4,498,177 | 2/1985 | Larson | 371/52 |
| 4,633,483 | 12/1986 | Takahashi et al. | 375/25 |
| 4,707,800 | 11/1987 | Montrone et al. | 364/788 |
| 4,771,379 | 9/1988 | Ando et al. | 364/200 |
| 4,989,168 | 1/1991 | Kuroda et al. | 364/715.09 |
| 5,095,457 | 3/1992 | Jeong | 364/758 |
| 5,187,679 | 2/1993 | Vassiliadis et al. | 364/786 |
| 5,218,431 | 6/1993 | Gleicher et al. | 358/13 |
| 5,287,420 | 2/1994 | Barret | 382/56 |
| 5,446,831 | 8/1995 | Yamashita et al. | 395/102 |

OTHER PUBLICATIONS

J. Shipnes, *Graphics Processing with the 88110 RISC Microprocessor*, IEEE (1992), pp. 169–174.

*MC88110 Second Generation RISC Microprocessor User's Manual*, Motorola, Inc. (1991).

*Errata to MC88110 Second Generation RISC Microprocessor User's Manual*, Motorola Inc. (1992), pp. 1–11.

*MC88110 Programmer's Reference Guide*, Motorola Inc. (1992), pp. 1–4.

*i860™ Microprocessor Family Programmer's Reference Manual*, Intel Corporation (1992), Ch. 1,3,8,12.

R.B. Lee, *Accelerating Multimedia Wtih Enhanced Microprocessors*, IEEE Micro (Apr. 1995), pp. 22–32.

*TMS320C2x User's Guide*, Texas Instruments (1993) pp. 3–2 through 3–11; 3–28 through 3–34; 4–1 through 4–22; 4–41; 4–103; 4–199 through 4–120; 4–122; 4–150 through 4–151.

(List continued on next page.)

*Primary Examiner*—Emmanuel L. Moise
*Attorney, Agent, or Firm*—Blakely, Sokoloff, Taylor & Zafman LLP

[57] ABSTRACT

A computer implemented method for compressing bit formats provided in a first packed data sequence. One embodiment of the method comprises the steps of generating, in response to executing a first instruction, a second packed data sequence by copying the first packed data sequence. A second step of masking, in response to executing a second instruction, a portion of the first packed data sequence. A third step of shifting data elements of the first packed data sequence, in response to executing a third instruction, wherein the data elements are independently shifted by separate shift counts. A fourth step of masking, in response to executing a fourth instruction, a portion of the second packed data sequence. A fifth step of generating, in response to executing a fifth instruction, a final result by joining the second and first packed data sequences.

18 Claims, 11 Drawing Sheets

OTHER PUBLICATIONS

L. Gwennap, *New PA–RISC Processor Decodes MPEG Video*, Microprocessor Report (Jan. 1994), pp. 16, 17.

SPARC Technology Business, *UltraSPARC Multimedia Capabilities On–Chip Support for Real–Time Video and Advanced Graphics*, Sun Microsystems (Sep. 1994).

Y. Kawakami et al., *LSI Applications: A Single–Chip Digital Signal Processor for Voiceband Applications*, Solid State Circuits Conference, Digest of Technical Papers; IEEE International (1980).

B. Case, *Philips Hopes to Displace DSPs with VLIW*, Microrprocessor Report (Dec. 94), pp. 12–15.

L. Gwennap, *UltraSparc Adds Multimedia Instructions*, Microprocessor Report (Dec. 94), pp. 16–18.

N. Margulis, *i860 Microprocessor Architecture*, McGraw Hill, Inc. (1990) Ch. 6,7,8,10,11.

*Pentium Processor User's Manual, vol. 3: Architecture and Programming Manual*, Intel Corporation (1993), Ch. 1,3,4, 6,8, and 18.

| 63 | 56 55 | 48 47 | 40 39 | 32 31 | 24 23 | 16 15 | 8 7 | 0 |
|---|---|---|---|---|---|---|---|---|
| bbbb bbbb | bbbb bbbb | bbbb bbbb | bbbb bbbb | bbbb bbbb | bbbb bbbb | bbbb bbbb | bbbb bbbb | |

Unsigned Packed Byte In-register Representation  310

| 63 | 56 55 | 48 47 | 40 39 | 32 31 | 24 23 | 16 15 | 8 7 | 0 |
|---|---|---|---|---|---|---|---|---|
| sbbb bbbb | sbbb bbbb | sbbb bbbb | sbbb bbbb | sbbb bbbb | sbbb bbbb | sbbb bbbb | sbbb bbbb | |

Signed Packed Byte In-register Representation  311

COMPUTER IMPLEMENTED METHOD FOR COMPRESSING 24 BIT PIXELS TO 16 BIT PIXELS

This is a continuation of application now U.S. Pat. No. 5,621,674 application Ser. No. 08/601,800, filed Feb. 15, 1996.

BACKGROUND OF THE INVENTION

1. Field of the Invention

The invention relates to computers and, more specifically, to the processing of pixel values.

2. Description of Related Art

Images displayed on computer monitors are generated by joining many miniature picture elements commonly referred to as pixels. The pixels are represented in a variety of formats. The most common pixel formats are 8-bit, 16-bit, and 24-bit.

The format used varies based upon such factors as the monitor, the graphics card, and the amount of memory intended to be used. Some of the formats are based on a combination of red, green, and blue values. For example, a twenty-four-bit pixel format is typically composed of eight bits of red data, eight bits of green data, and eight bits of blue data. The format is commonly referred to as an 8/8/8 format following Red/Green/Blue, and is a common pixel format used for storing the pixel bits in a memory array.

Not all pixel formats are based on some combination of the colors red, green, and blue. The 8-bit format, for example, is often referred to as a Color Look Up Table (CLUT index). In this case, each 8-bit pixel is an index into an array of 256 arbitrary colors. However, in the remainder of the present application, it will be assumed that pixels are provided as red, green, and blue bits.

Twenty-four-bit pixels, however, are considered to be very expensive for storage and generating images on a color monitor. As a result, there continues to be an abundance of video displays that require 16-bit pixels. As such, when an image represented by twenty-four-bit pixels is input into computer system (e.g., scanned), it is typically compressed into a sixteen-bit pixels before it is stored or can be generated as an image to be displayed on a monitor.

Moreover, the pixels are frequently used in on-line real time video applications, which are very performance-sensitive. Any slowdown in the application could result in slower video playback, less stunning graphics in video games, or some other related detraction from a visual experience. As such, there exist a continuous need to increase the speed of compressing the pixels from 24-bit pixels to 16-bit pixels in order to increase the performance of video applications.

Typically, compressing the 24-bit pixels into 16-bit pixels involves separating the colors of a pixel by copying each color into separate registers. Separate instructions are then used to individually mask each of the colors into target sizes, and separate instructions are again used to individually shift the colors into relative final positions. The colors are then logically OR-ed into one register in order to present a 16-bit pixel.

Advancements in computer architecture, however, provide an ability to process small integer data values more efficiently. More specifically, the advancements include the ability to process multiple small integer data values in parallel in response to a single instruction, otherwise referred to as a Single Instruction Multiple Data, hereinafter referred to as an SIMD. The multiple data elements are joined together as packed data sequences. The packed data sequences provide a single data structure storing of up to sixty-four-bits of integer data in one register, wherein the sequence includes multiple data elements of equal size.

Therefore, what is needed is an accelerated method for compressing 24-bit pixels to 16-bit pixels by using 64-bit packed data sequences and related SIMD instructions, so as to enhance the visual experience of video and related applications.

SUMMARY OF THE INVENTION

The present invention provides a computer implemented method for compressing bit formats provided in a first packed data sequence. One embodiment of the method comprises the steps of generating, in response to executing a first instruction, a second packed data sequence by copying the first packed data sequence. A second step of masking, in response to executing a second instruction, a portion of the first packed data sequence. A third step of shifting data elements of the first packed data sequence, in response to executing a third instruction, wherein the data elements are independently shifted by separate shift counts. A fourth step of masking, in response to executing a fourth instruction, a portion of the second packed data sequence. A fifth step of generating, in response to executing a fifth instruction, a final result by joining the second and first packed data sequences.

DETAILED DESCRIPTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Computer System of the Invention

Figure 1:
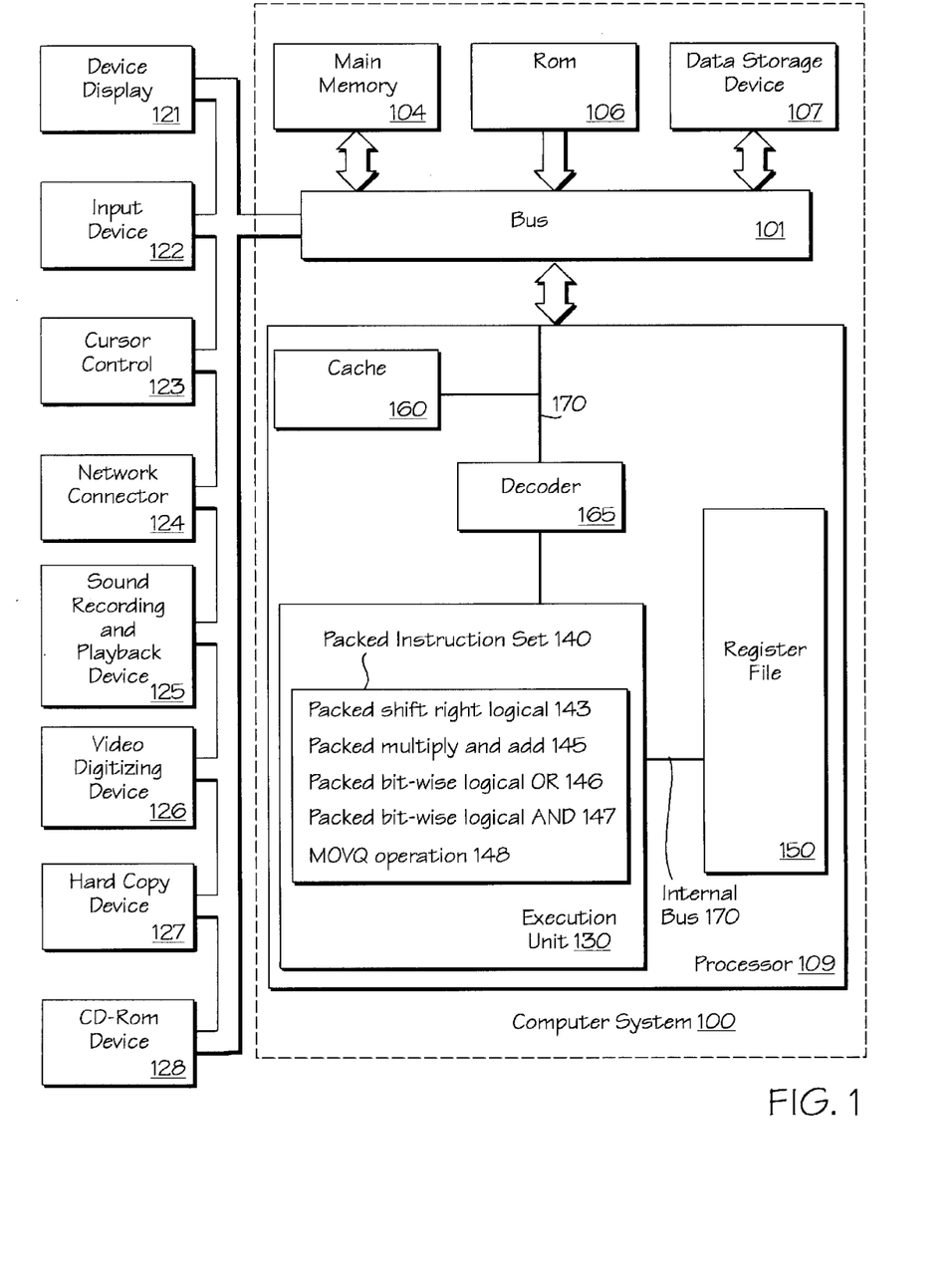
FIG. 1 illustrates a computer system capable of implementing one embodiment of the present invention.

FIG. 1 shows a computer system 100 upon which one embodiment of the present invention could be implemented. Computer system 100 comprises a bus 101 for communicating information, processor 109 coupled to bus 101 for processing information, and memory subsystem 104–107 coupled to bus 101 for storing information and instructions for processor 109.

Processor 109 includes an execution unit 130, a register file 150, a cache memory 160, a decoder 165, and an internal bus 170. Cache memory 160, storing frequently and/or recently used information for processor 109, is coupled to execution unit 130. Register file 150 stores information in processor 109 and is coupled to execution unit 130 via internal bus 170. In one embodiment of the invention, register file 150 includes multimedia registers for storing multimedia information. In one embodiment, the multimedia registers each store up to sixty-four bits of packed data. Multimedia registers may be dedicated multimedia registers or registers which are used for storing multimedia information and other information. In one embodiment, multimedia registers store multimedia data when performing multimedia operations and store floating point data when performing floating point operations.

Execution unit 130 operates on packed data according to the instructions received by processor 109 that are included in packed instruction set 140. Execution unit 130 also operates on scalar data according to instructions implemented in general-purpose processors. Processor 109 is capable of supporting the Pentium® microprocessor instruction set and the packed instruction set 140. By including packed instruction set 140 into a standard microprocessor instruction set, such as the Pentium® microprocessor instruction set, packed data instructions can be easily incorporated into existing software (previously written for the standard microprocessor instruction set). Other standard instruction sets, such as the PowerPC™ and the Alpha™ processor instruction sets may also be used in accordance with the described invention. (Pentium® is a registered trademark of Intel Corporation. PowerPC™ is a trademark of IBM, APPLE COMPUTER, and MOTOROLA. Alpha™ is a trademark of Digital Equipment Corporation.)

In one embodiment, packed instruction set 140 includes instructions for executing a packed shift right logical 143, a packed multiply and add (PMADD) 145, a packed bit-wise logical OR (POR) 146, a packed bit-wise logical AND (PAND) 147, and a MOVQ operation 148.

By including packed instruction set 140 in the instruction set of general-purpose processor 109 along with associated circuitry to execute the instructions, the operations used by many existing multimedia applications may be performed using packed data in a general-purpose processor. Thus, many multimedia applications may be accelerated and executed more efficiently by using the full width of a processor's data bus for performing operations on packed data. This eliminates the need to transfer smaller units of data across the processor's data bus to perform one or more operations one data element at a time.

Still referring to FIG. 1, the computer system 100 of the present invention may include a display device 121 such as a monitor. The display device 121 may include an intermediate device such as a frame buffer. The computer system 100 includes an input device 122 such as a keyboard, and a cursor control 123 such as a mouse, or trackball, or trackpad. The display device 121, the input device 122, and the cursor control 123 are coupled to bus 101. Computer system 100 may also include a network connector 124 such that computer system 100 is part of a local area network (LAN) or a wide area network (WAN).

Additionally, computer system 100 can be coupled to a device for sound recording, and/or playback 125, such as an audio digitizer coupled to a microphone for recording voice input for speech recognition. Computer system 100 may also include a video digitizing device 126 that can be used to capture video images, a hard copy device 127 such as a printer, and a CD-ROM device 128. The devices 124–128 are also coupled to bus 101.

Data and Storage Formats

Figure 2:
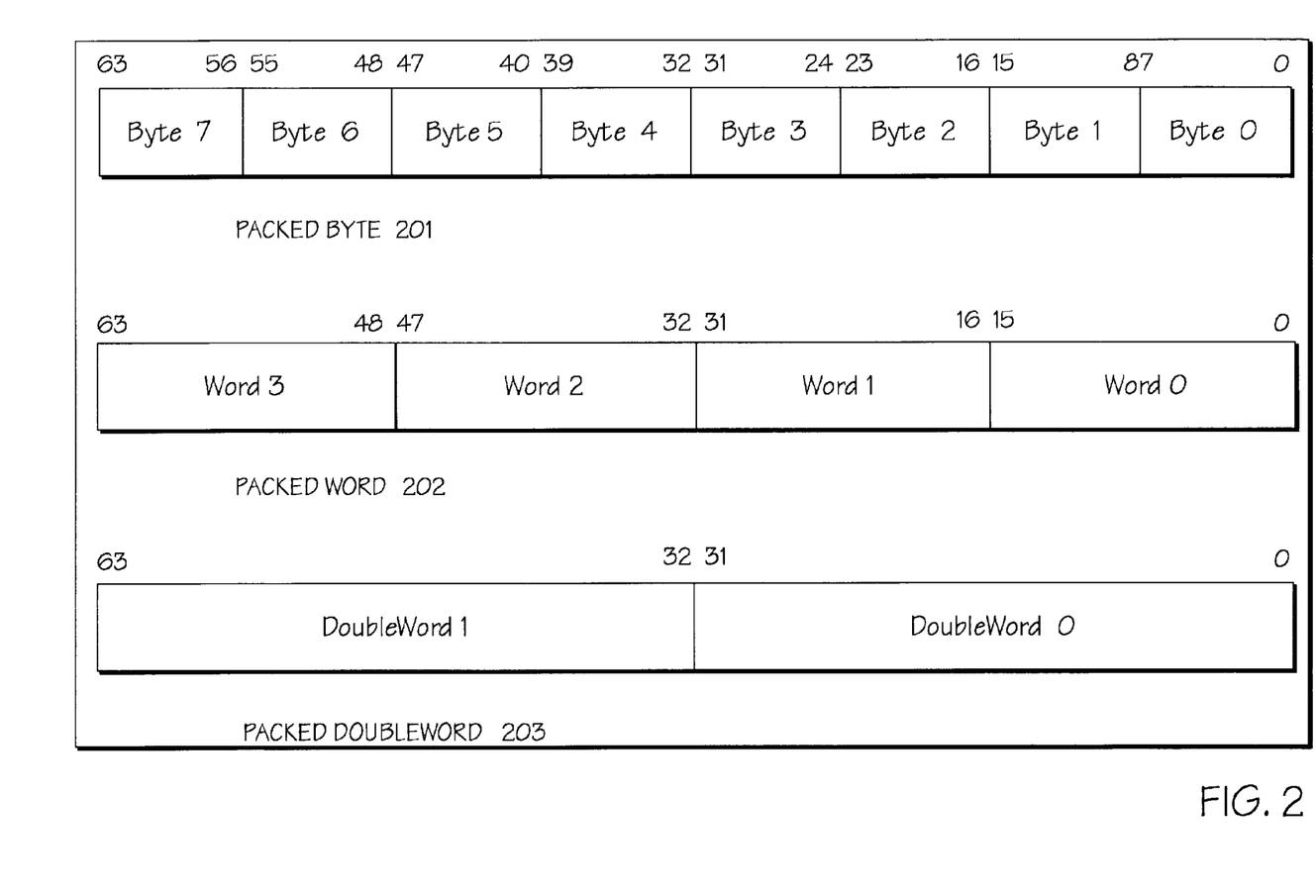
FIG. 2 illustrates packed data-types according to one embodiment of the invention.

FIG. 2 illustrates three packed data-types: packed byte 201, packed word 202, and packed doubleword (dword) 203. Packed byte 201 is sixty-four bits long containing eight packed byte data elements. Generally, a data element is an individual piece of data that is stored in a single register (or memory location) with other data elements of the same length. In packed data sequences, the number of data elements stored in a register is sixty-four bits divided by the length in bits of a data element.

Packed word 202 is sixty-four bits long and contains four packed word data elements. Each packed word contains sixteen bits of information.

Packed doubleword 203 is sixty-four bits long and contains two packed doubleword data elements. Each packed doubleword data element contains thirty-two bits of information. A packed quadword is 64-bits long and contains one packed quadword data element.

Figure 3A:
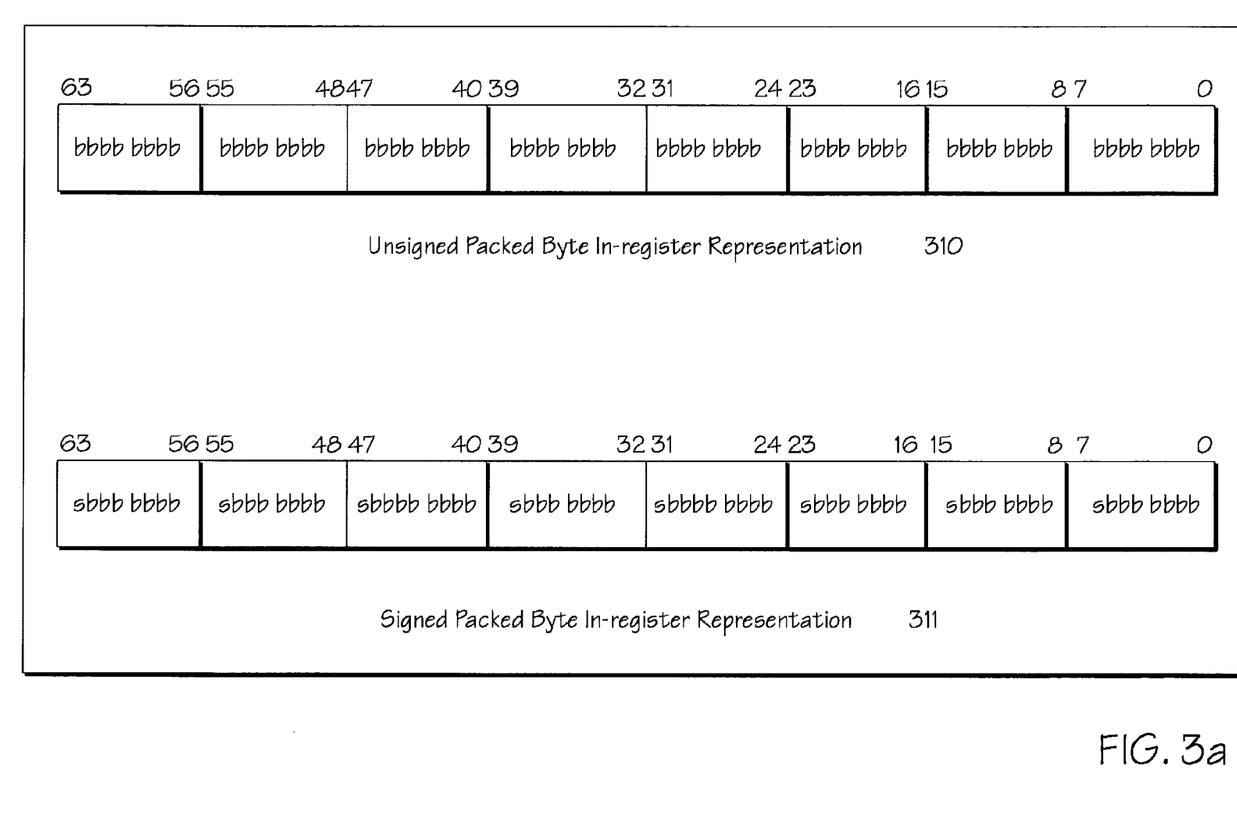
FIG. 3a illustrates in-register packed byte representations according to one embodiment of the invention.
Figure 3B:
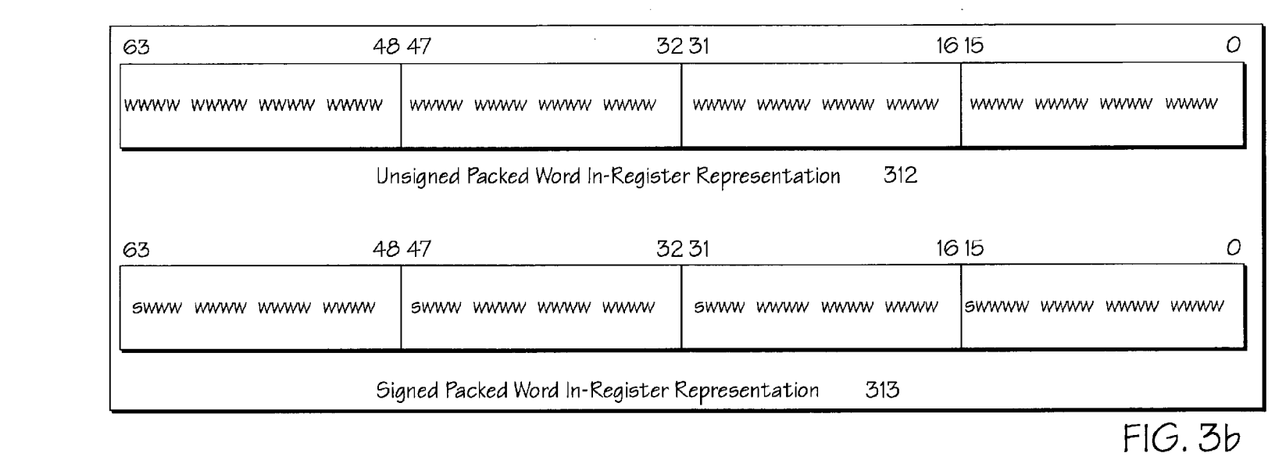
FIG. 3b illustrates in-register packed word representations according to one embodiment of the invention.
Figure 3C:
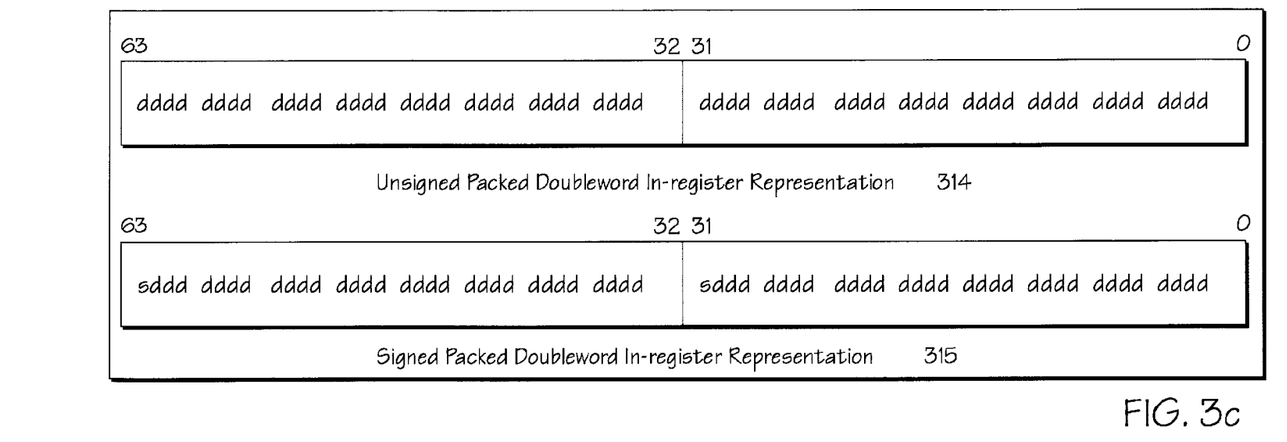
FIG. 3c illustrates in-register packed double word representations according to one embodiment of the invention.

FIGS. 3a through 3c illustrate the in-register packed data storage representation according to one embodiment of the invention. Unsigned packed byte in-register representation 310 illustrates the storage of an unsigned packed byte 201 in one of the multimedia registers 151, as shown in FIG. 3a. Information for each byte data element is stored in bit seven through bit zero for byte zero, bit fifteen through bit eight for byte one, bit twenty-three through bit sixteen for byte two, bit thirty-one through bit twenty-four for byte three, bit thirty-nine through bit thirty-two for byte four, bit forty-seven through bit forty for byte five, bit fifty-five through bit forty-eight for byte six and bit sixty-three through bit fifty-six for byte seven. Thus, all available bits are used in the register. This storage arrangement increases the storage efficiency of the processor. As well, with eight data elements accessed, one operation can now be performed on eight data elements simultaneously. Signed packed byte in-register representation 311 illustrates the storage of a signed packed byte 201. Note that the eighth bit of every byte data element is the sign indicator.

Unsigned packed word in-register representation 312 illustrates how word three through word zero are stored in a register of multimedia registers 151, as illustrated in FIG. 3b. Bit fifteen through bit zero contain the data element information for word zero, bit thirty-one through bit sixteen contain the information for data element word one, bit forty-seven through bit thirty-two contain the information for data element word two and bit sixty-three through bit forty-eight contain the information for data element word three. Signed packed word in-register representation 313 is similar to the unsigned packed word in-register representation 312. Note that the sixteenth bit of each word data element is the sign indicator.

Unsigned packed doubleword in-register representation 314 shows how multi-media registers 151 store two doubleword data elements, as illustrated in FIG. 3c. Doubleword zero is stored in bit thirty-one through bit zero of the register. Doubleword one is stored in bit sixty-three through bit thirty-two of the register. Signed packed doubleword in-register representation 315 is similar to unsigned packed doubleword in-register representation 314. Note that the necessary sign bit is the thirty-second bit of the doubleword data element.

Packed Data Instructions of the Invention

Referring now to FIGS. 4–10 the instructions of packed instruction set 140 are described in more detail. In each example described below, the operands are packed data located in multimedia registers 151. Alternate embodiments may access the operands and/or the results directly from memory 104. In other embodiments, these registers can be stored in a general purpose register file.

Figure 4:
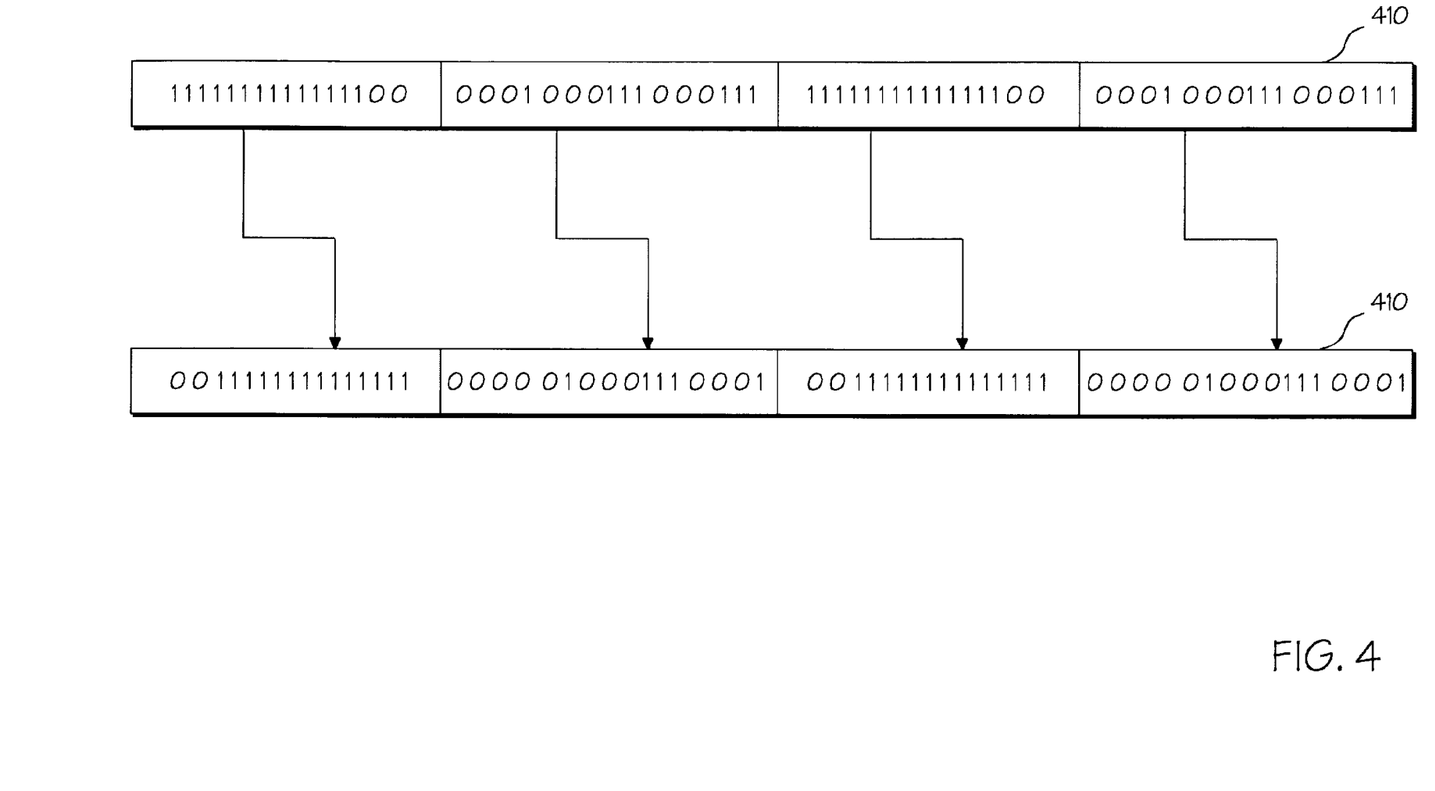
FIG. 4 illustrates the packed shift right logical operation used in one embodiment in the method of the present invention.

FIG. 4 illustrates the PSRL 143 operation. The instruction independently shifts each data element in register 410 to the right by the scalar shift count. The high-order bits of each element are filled with zero. The shift count is interpreted as unsigned. Shift counts greater than 15 (for words) 31 (for doublewords) or 63 (otherwise) yield all zeros. In order to shift individual dwords by the shift count, the PSRL is codified as PSRLD.

Figure 5:
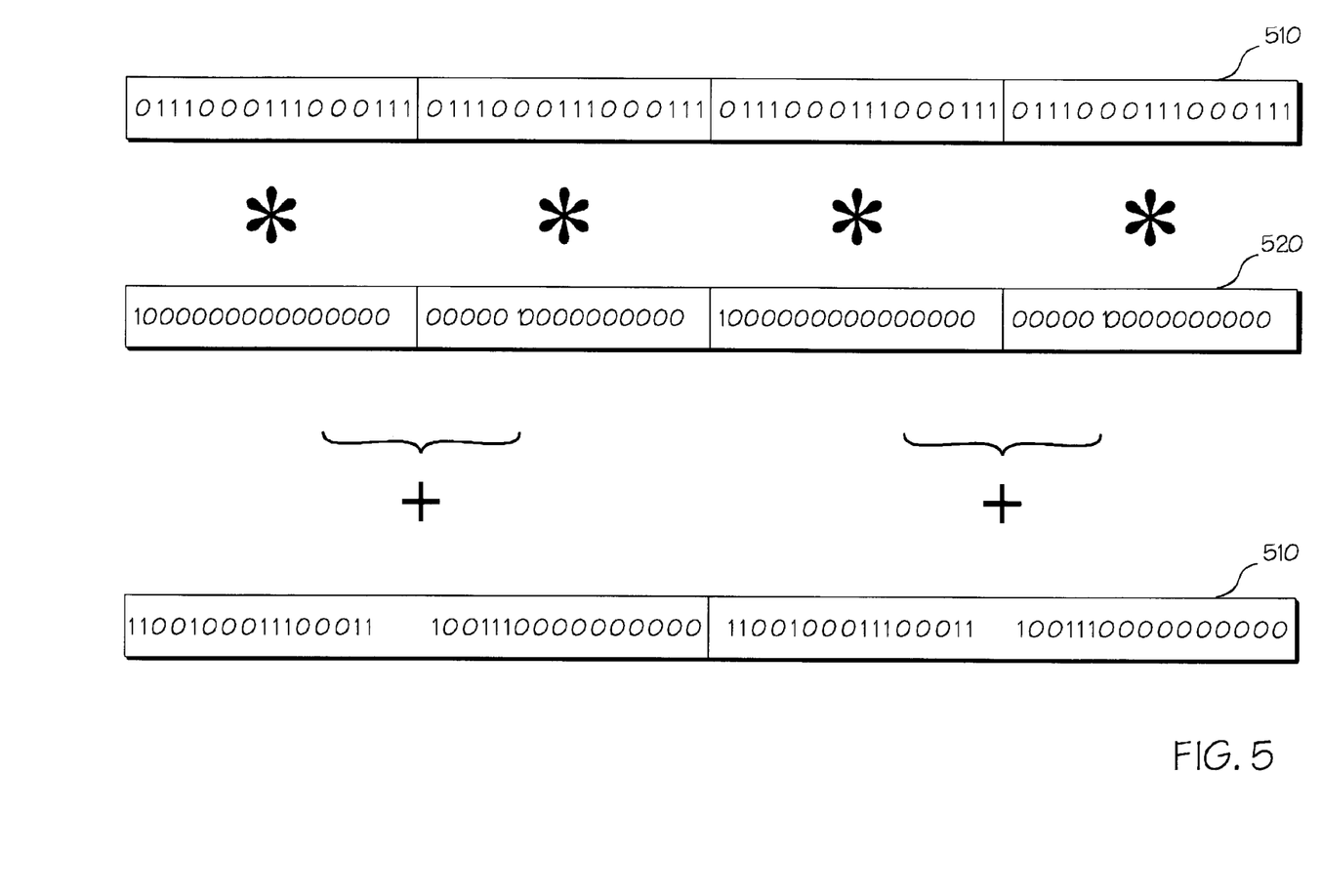
FIG. 5 illustrates the packed multiply and add operation used in one embodiment in the method of the present invention.

FIG. 5 illustrates the PMADD 145 operation. In the PMADD 145 operation, the signed packed words of register 510 are multiplied with the corresponding packed words of register 520. The 32-bit intermediate results are summed by pairs, producing two 32-bit integer results. In cases which overflow, the results are truncated.

Figure 6:
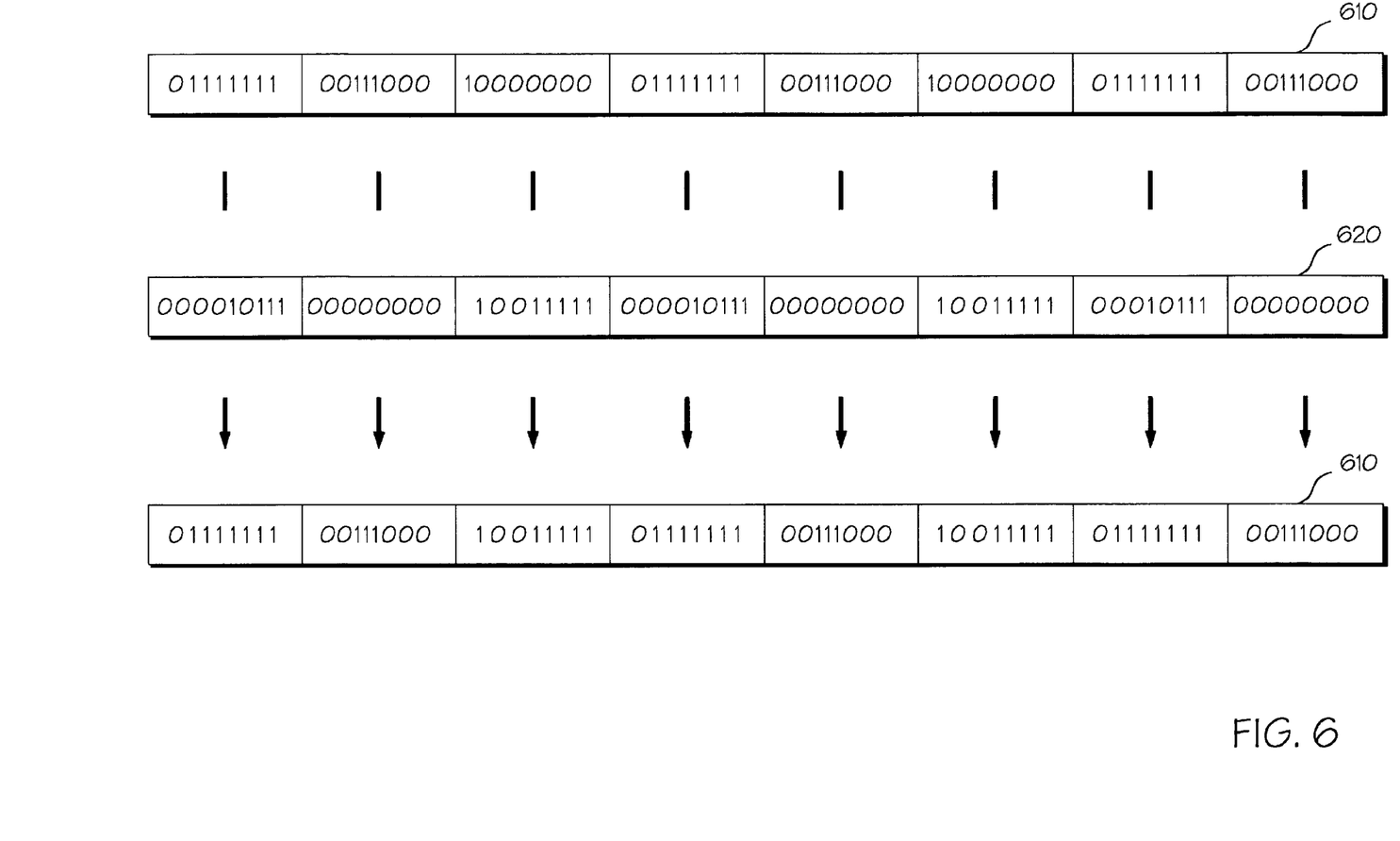
FIG. 6 illustrates the packed bit-wise logical OR operation used in one embodiment in the method of the present invention.

FIG. 6 illustrates the POR 146 operation. In the POR 146 operation a bit-wise logical Or is performed on corresponding packed data elements of registers 610 and 620, with results stored in register 610.

Figure 7:
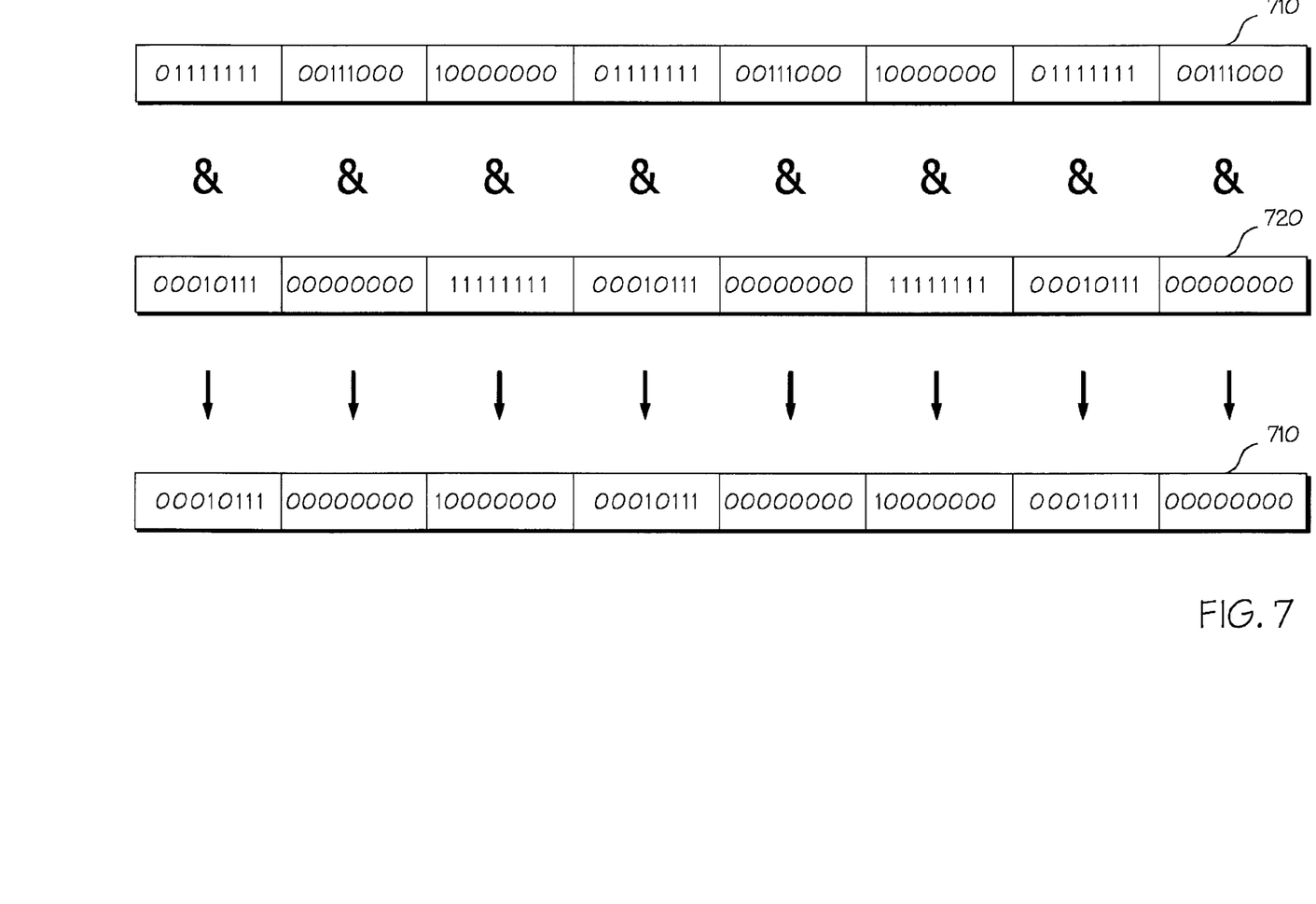
FIG. 7 illustrates the packed bit-wise logical AND operation used in one embodiment in the method of the present invention.

FIG. 7 illustrates the PAND 147 instruction. In the PAND 147 instruction a bit-wise logical AND is performed on corresponding packed data elements of registers 710 and 720, with results stored in register 710.

Figure 8:
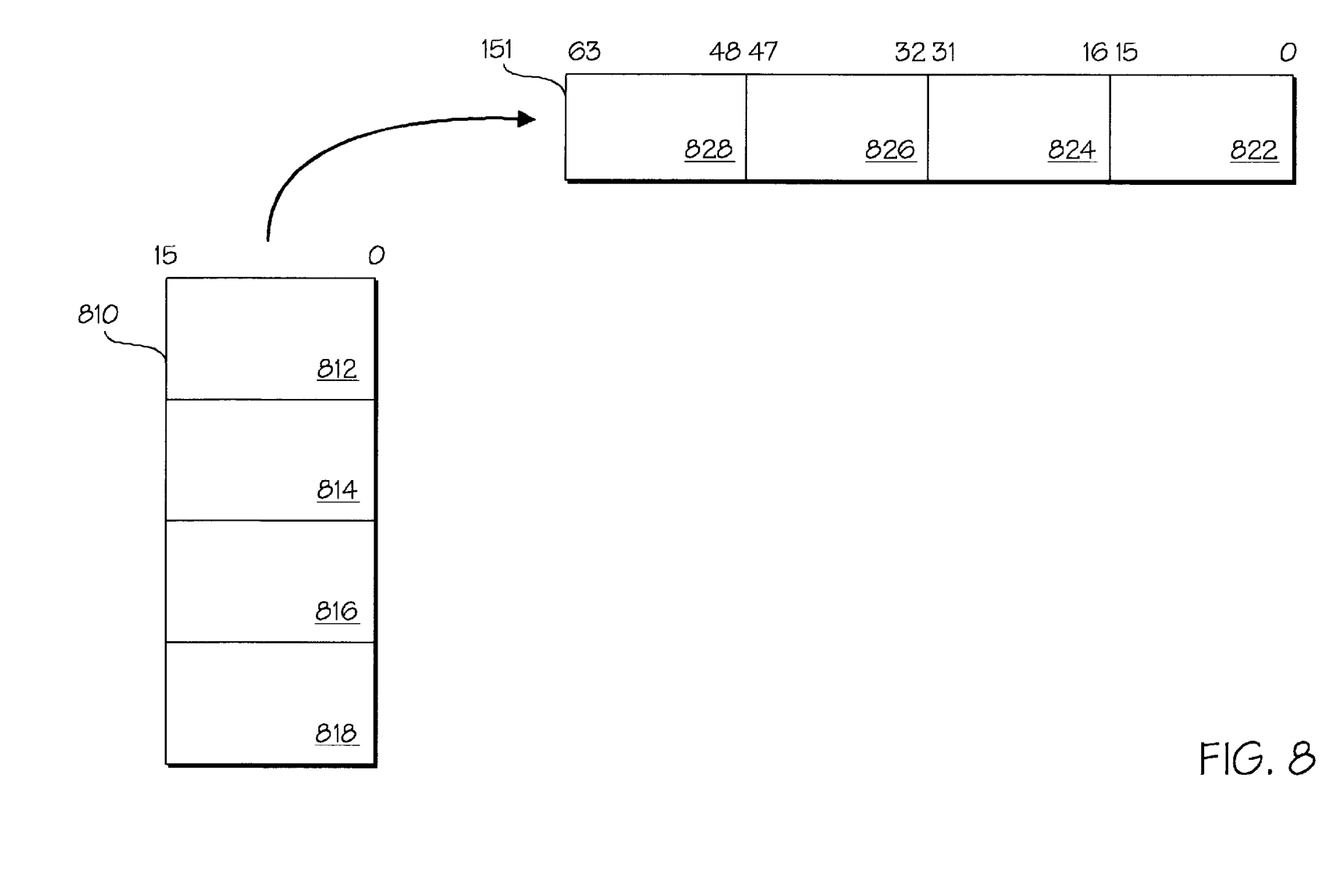
FIG. 8 illustrates the MOVQ operation used in one embodiment in the method of the present invention.

FIG. 8 illustrates an example of the MOVQ 148 operation. The MOVQ 148 operation is used to transfer sixty-four data bits, four packed words, to and from the multimedia registers. As shown in FIG. 8, packed data sequence 810, having packed words 812, 814, 816 and 818 located in memory are transferred to a multimedia register, and stored in register 151 as packed words 822, 824, 826, and 828, respectively.

METHOD OF COMPRESSING PIXEL BITS

As previously mentioned, the invention relates to a novel and accelerated method of compressing 24-bit pixels into 16-bit pixels. In particular, the invention involves a unique method of using data values in packed data sequences, and unique packed data instructions to provide a faster and more efficient method of compressing 24-bit pixels into 16-bit pixels.

As illustrated in FIG. 9 and below in Table 1, two pixels are presented within a single register as a packed data sequence, with each color of a pixel occupying a separate packed byte within the register. As illustrated herein, it is assumed that the 24-bit pixels are located in the low 24 bits of each dword of the packed data sequence. Moreover, as illustrated herein by way of examples, each packed byte storing a color of a pixel is formatted as follows:

TABLE 1

* Upper Case Bits will end up in compressed 16-bit pixel format
* Lower Case Bits are part of 24-bit pixel but will be removed during compression.
* X = insigificant bits
XXXXXXXX   RRRRRrrr  GGGGGggg  BBBBBbbb   XXXXXXXX   RRRRRrrr  GGGGGggg  BBBBBbbb The goal of the compression is the bit pattern shown below in Table 2 showing two 16-bit pixels, each stored in a separate packed word:

TABLE 2

XXXXXXXXXXXXXXXX   XRRRRGGGGGBBBBB  XXXXXXXXXXXXXXXX   XRRRRGGGGGBBBBB

Figure 9A:
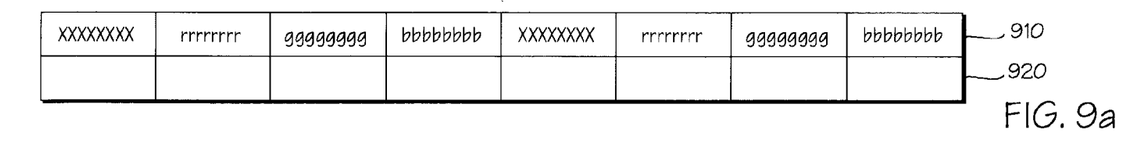
FIGS. 9a–9f illustrate in-register packed data representation of the steps used in one embodiment in the method of the present invention.
Figure 9B:
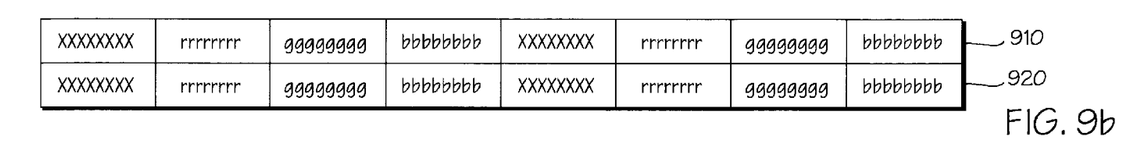
Figure 9C:
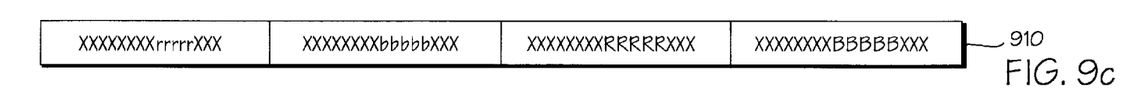
Figure 9D:
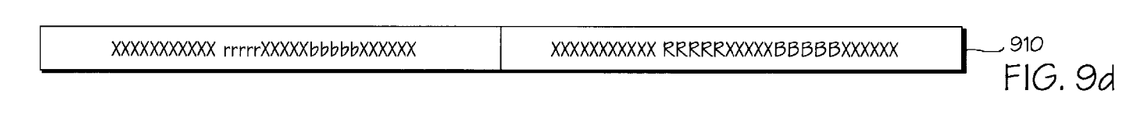
Figure 9E:
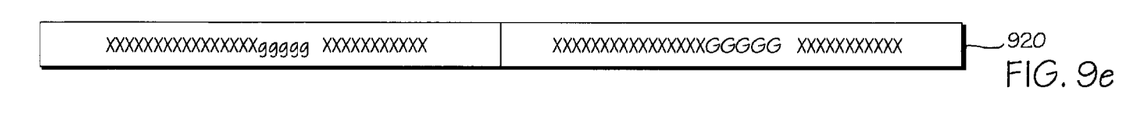
Figure 9F:
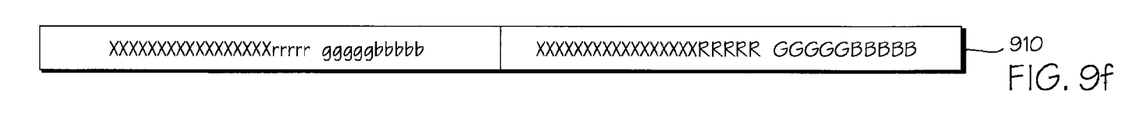
Figure 10:
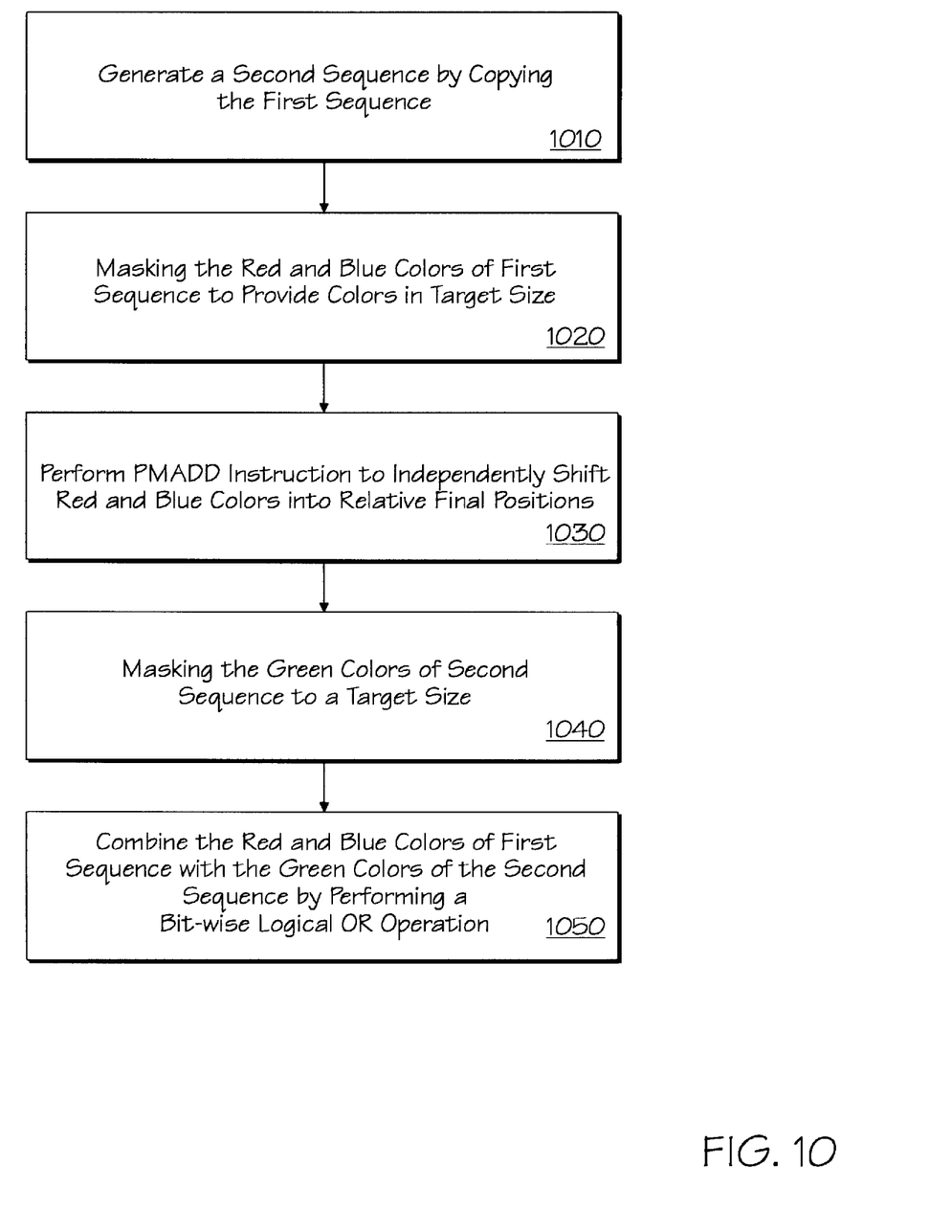
FIG. 10 illustrates a block diagram of the steps used in one embodiment of the method of the present invention.

The steps for one embodiment of the present invention are illustrated as in-register representations in FIGS. 9a–9f and further illustrated in the block diagram of FIG. 10. As illustrated in FIG. 9a, register 910 contains two 24-bit pixels and register 920 is used as a scratch register.

In processing block 1010, the contents of the register 910 are copied to register 920 by using a MOVQ 148 instruction, as illustrated in FIG. 9b. In processing block 1020, everything in register 910 is masked to zero except for the significant color bits of the red and blue colors which will be used in the final 16-bit pixel, as illustrated in FIG. 9c. In one embodiment, the 64 bits of color in register 910 are masked with the hexadecimal value 00f8|00f8|00f8|00f8, by using the PAND 147 instruction. The step in processing block 1020 provides the red and blue colors in target size.

In processing block 1030, as illustrated in FIG. 9d, the packed words in register 910 are independently shifted by different amounts so as to separate the respective red and blue color values by only 5 bits, thereby generating an intermediate result. The green colors of register 920 can then be inserted between the red and blue colors of register 910. The independent shifting is performed by using the PMADD 145 instruction.

The present invention takes advantage of the PMADD 145 instruction to shift and combine the red and blue colors into their relative final position in response to a single instruction. Moreover, in light of the PMADD 145 instruction only supporting packed word operations, the present invention overcomes the assumption that it is necessary to unpack each byte of color into separate packed words in order to use the PMADD 145 instruction. By initially ignoring the green color bytes, the red and blue color bytes can be operated on as packed words. By carefully choosing the multiplication factor used for each of these colors, the red and blue bytes can be shifted into their relative final positions and are simply OR-ed with the green bits of the second sequence, as illustrated in FIG. 9d.

More specifically, in one embodiment of the present invention, the second and fourth packed words of register 910 are multiplied by values that generate a 32-bit product representing the red colors shifted to the left by 13 bit positions. The first and third packed words are multiplied by values that generate a product representing the blue colors shifted to the left by only 3 bit positions. Next, the adjacent 32 bit results are added and stored in register 910 as dwords, as illustrated in FIG. 9d. In one embodiment, the packed words represented in register 910 are multiplied with the corresponding word values represented as: 0x 2000 0008 2000 0008.

In processing block 1040, everything in register 920 is masked to zero except for the significant color bits of the green colors which will be used in the final 16-bit pixels, as illustrated in FIG. 9e. In one embodiment, the sequence in register 920 is masked with the hexadecimal value 0x 0000 f800 0000 f800, through the use of the PAND 147 instruction.

In processing block 1050, a bit-wise OR operation is performed between registers 910 and 920 using the POR instruction 146. As a result, the red, green, and blue colors will be combined into register 910, wherein each pixel is represented in 15 bits in separate dwords, as illustrated in FIG. 9f. Each pixel may then be shifted within the separate dwords by 6 bit positions to the right to their final positions by executing a PSRLD, as illustrated in FIG. 9f.

In a second embodiment, the method of the present invention is even more efficient when used to process an additional 6 pixels through the pairing of instructions. More specifically, the PMADD 145 instruction takes three clock cycles to complete. As a result, instructions to read in additional pixels and initiate the compression of the pixels can be done while waiting for the PMADD results of the original pixel values.

From the above description, it will be apparent that the invention disclosed herein provides a novel and advantageous computer implemented method of compressing 24-bit pixels to 16-bit pixels. As will be understood by those familiar with the art, the invention may be embodied in other specific forms without departing from its essential features, and thus, the described embodiments are not restrictive of the scope of the invention. The following claims are indicative of the scope of the invention, and all variations which come within the meaning and range of equivalency of the claims are to be embraced within their scope.

What is claimed is:

1. In a computer system, a method for compressing bit formats in a first packed data sequence, said method comprising the steps of:

generating a second packed data sequence by copying said first packed data sequence;

masking a portion of said first packed data sequence;

shifting data elements of said first packed data sequence, in response to executing a single first instruction, wherein said data elements are independently shifted by separate shift counts;

masking a portion of said second packed data sequence; and generating a final result by joining said second and first packed data sequences.

2. The method of claim 1, wherein said first packed data sequence includes a first, second, and third datum; and said final result having one packed word representing said three datums.

3. The method of claim 2, wherein said step of shifting includes multiplying data elements of said first packed data sequence with corresponding data elements of a third packed data sequence, and adding adjacent products.

4. The method of claim 3, wherein said step of shifting includes shifting said first datum to a bit position adjacent to a most significant bit position of a second datum in said second packed data sequence, and shifting said third datum to a bit position adjacent to a least significant bit position of said second datum in said second packed data sequence.

5. The method of claim 4, wherein in said step of shifting, said adding of adjacent products performs a bit-wise logical Or operation between a first and second product.

6. The method of claim 5, wherein said step of masking said portion of said first packed data sequences includes masking all bits of said second datum and masking said first and third datums to a target size; and said step of masking said portion of said second packed data sequence, includes masking said second datum to a target size and masking all bits of said first and third datum.

7. The method of claim 6, wherein said step of generating a final result includes performing a bit-wise logical OR operation between said first and second packed data sequences; and said step of shifting further includes generating a packed word having two datums placed in a packed word.

8. The method of claim 7, wherein said first, second, and third datums jointly represent a pixel, wherein each of said datums represent a color.

9. The method of claim 8, wherein said first packed data sequence further includes a fourth, fifth, and sixth datum; and said final result further includes a second packed word representing said fourth, fifth, and sixth datums.

10. A machine-readable medium having stored thereon data representing sequences of instructions for compressing bit formats in a first packed data sequence, said sequences of instruction which, when executed by a processor, cause said processor to perform the steps comprising of:

generating a second packed data sequence by copying said first packed data sequence;

masking a portion of said first packed data sequence;

shifting data elements of said first packed data sequence, in response to executing a single first instruction, wherein said data elements are independently shifted by separate shift counts;

masking a portion of said second packed data sequence; and generating a final result by joining said second and first packed data sequences.

11. The machine-readable medium of claim 10, wherein said first packed data sequence includes a first, second, and third datum; and said final result having one packed word representing said three datums.

12. The machine-readable medium of claim 11, wherein said step of shifting includes multiplying data elements of said first packed data sequence with corresponding data elements of a third packed data sequence, and adding adjacent products.

13. The machine-readable medium of claim 12, wherein said step of shifting includes shifting said first datum to a bit position adjacent to a most significant bit position of a second datum in said second packed data sequence, and shifting said third datum to a bit position adjacent to a least significant bit position of said second datum in said second packed data sequence.

14. The machine-readable medium of claim 13, wherein in said step of shifting, said adding of adjacent products performs a bit-wise logical Or operation between a first and second product.

15. The machine-readable medium of claim 14, wherein said step of masking said portion of said first packed data sequences includes masking all bits of said second datum and masking said first and third datums to a target size; and said step of masking said portion of said second packed data sequence, includes masking said second datum to a target size and masking all bits of said first and third datums.

16. The machine-readable medium of claim 15, wherein said step of generating a final result includes performing a bit-wise logical OR operation between said first and second packed data sequences; and said step of shifting further includes generating a packed word having two datums placed in a packed word.

17. The machine-readable medium of claim 16, wherein said first, second, and third datums jointly represent a pixel, wherein each of said datums represent a color.

18. The machine-readable medium of claim 17, wherein said first packed data sequence further includes a fourth, fifth, and sixth datum; and said final result further includes a second packed word representing said fourth, fifth, and sixth datums.

* * * * *